United States Patent [19]
Gonzalez

[11] Patent Number: 5,981,367
[45] Date of Patent: Nov. 9, 1999

[54] METHOD FOR MAKING AN ACCESS TRANSISTOR

[75] Inventor: Fernando Gonzalez, Boise, Id.

[73] Assignee: Micron Technology, Inc., Boise, Id.

[21] Appl. No.: 08/733,321

[22] Filed: Oct. 17, 1996

[51] Int. Cl.⁶ ...................... H01L 21/3205; H01L 21/324
[52] U.S. Cl. .......................... 438/593; 438/587; 438/592; 438/596; 438/655; 438/657; 438/666
[58] Field of Search .................... 438/586, 587, 438/592, 593, 595, 596, 655, 656, 657, 660, 666, 668, 669, 672

[56] References Cited

U.S. PATENT DOCUMENTS

| | | | |
|---|---|---|---|
| 5,147,820 | 9/1992 | Chittipeddi et al. | 438/592 |
| 5,518,958 | 5/1996 | Giewont et al. | 438/592 |
| 5,576,228 | 11/1996 | Chen et al. | 438/302 |
| 5,616,948 | 4/1997 | Pfiester | 257/412 |
| 5,698,072 | 12/1997 | Fukuda | 438/592 |

OTHER PUBLICATIONS

W.R. Hunter, et al., New Edge–Defined Vertical–Etch Approaches for Submircometer Mosfet Fabrication, IEEE, 1980, pp. 764–767.

*Primary Examiner*—John F. Niebling
*Assistant Examiner*—Ha Tran Nguyen
*Attorney, Agent, or Firm*—Workman, Nydegger & Seeley

[57] ABSTRACT

Methods are disclosed for the fabrication of novel polysilicon structures having increased surface areas to achieve lower resistances after silicidation. The structures are applicable, for example, to semiconductor interconnects, polysilicon gate, and capacitor applications. The inventive method provides additional means of obtaining suitable sheet resistivity and resistances for deep submicron applications. Techniques are disclosed for improving the conductivities of a silicided gate structure, a silicided interconnect structure, and capacitor component structures, each of such are situated on a substrate assembly, such as a semiconductor wafer.

19 Claims, 10 Drawing Sheets

METHOD FOR MAKING AN ACCESS TRANSISTOR

BACKGROUND OF THE INVENTION

1. The Field of the Invention

The present invention relates the manufacture of a semiconductor device on a substrate assembly, where the substrate assembly is a substrate having one or more layers or structures formed thereon. More specifically, the present invention relates to the fabrication of a polysilicon structure used in the manufacture of a semiconductor device on a substrate assembly. Even more specifically, the present invention relates to techniques for improving the conductivities of a silicided gate structure and a silicided interconnect structure on a substrate assembly.

2. The Relevant Technology

Polycrystalline silicon (polysilicon) is the preferred material for gate electrodes in MOSFET structures. Polysilicon is advantageous over metal gate electrodes as it can withstand much higher subsequent processing temperatures before eutectic temperatures are reached. Polysilicon is readily deposited on bulk silicon or SiO2 using low pressure chemical vapor deposition (LPCVD), and the resistivities of doped polysilicon films are less than those of doped epitaxial or bulk silicon layers.

As the drive toward integrating more active devices on a single integrated circuit necessitates the fabrication of increasingly small MOSFET structures, the resistance of the MOSFET gate becomes a limiting factor in device speed. As such, it is beneficial to use materials with the lowest possible sheet resistivities for making contact with the polysilicon gate structure. To this end it is well known that refractory metal suicides can be readily formed on polysilicon MOSFET gate structures using conventional sputtering, deposition, and annealing processes. The refractory metal silicides have low sheet resistivities after annealing and also form low resistance ohmic contacts with commonly used interconnect metals.

Of all the available silicides, titanium disilicide ($TiSi_2$) is preferred due to its inherent low sheet resistivity when annealed to the C54 crystalline phase thereof. To obtain the desired low resistivity requires high temperature annealing in a range from about 700° C. to about 1100° C. Numerous techniques for creating $TiSi_2$ films on MOSFET gate, source, and drain electrodes are used to obtain the desired low sheet resistivity. An example of such a technique is the chemical vapor deposition (CVD) of either pure titanium metal or stoichiometric titanium silicide ($TiSi_x$), with subsequent annealing steps to convert the layer to $TiSi_2$ in the C54 crystalline phase thereof.

Limitations are known to exist with respect to the processing of $TiSi_x$ films, particularly as MOSFET transistor geometries are scaled down to deep submicron dimensions. It is known that the lowest obtainable sheet resistivities of annealed $TiSi_2$ films are only achieved when the silicide completely transforms to the C54 crystalline phase. It has more recently been discovered that achieving complete C54 crystalline phase transformation as conductor line width dimensions are scaled below about 0.5 microns requires increasingly higher processing temperatures. Such higher processing temperatures create problems such as induced layer defects due to the agglomeration of the silicided metal, and other problems. An agglomeration of a $TiSi_x$ film on a polysilicon gate having a length below about 0.25 microns can cause an increase in resistance from a normal 1 2 Ohms per square to 20–30 times the resistance.

Accordingly, it would be an advance in the art to fabricate semiconductor interconnects, conductors, and transistor gates using established, reliable processing methods and materials, each of which have a suitably low resistivity so that overall semiconductor device speed and performance is maintained when such structures are scaled down to deep submicron dimensions.

SUMMARY OF THE INVENTION

The present invention describes novel methods of making gate structures and interconnect line structures having complex surfaces, which are useful in the fabrication of semiconductor devices. The geometries of the structures, when combined with fabrication methods disclosed, provide for significantly increased areas of exposed polysilicon or amorphous silicon material on which refractory metal layers can be deposited. As such, there is a significant increase in the total cross-sectional area of the regions over which polycide regions (e.g. refractory metal silicides) may potentially be formed in subsequent annealing steps. The increased cross-sectional area of the polycide regions compensates for the increase in polycide sheet resistivity which is observed as semiconductor device geometries are scaled to deep submicron line widths, thereby reducing the effective series resistance of the gate or conductor line structures and of the contact interfaces thereto. Furthermore, when the refractory metal layer consists of titanium metal or as-deposited titanium silicide, the increased surface area may contribute to a lowering of processing temperatures required to achieve a complete transformation of the titanium silicide to the C54 crystalline phase, thereby lowering the overall sheet resistivity in addition to increasing the surface area. The increase in surface area of polycide regions can be accomplished by forming various structures having surfaces upon which the polycide regions are formed.

BRIEF DESCRIPTION OF THE DRAWINGS

A more particular description of the invention briefly described above will be rendered by reference to specific embodiments and applications thereof which are illustrated in the appended drawings. Understanding that these drawings depict only typical embodiments and applications of the invention and are not therefore to be considered to be limiting of its scope, the invention will be described and explained with additional specificity and detail through the use of the accompanying drawings in which.

DETAILED DESCRIPTION OF THE PREFERRED EMBODIMENTS

Preferred embodiments of the invention are shown and described in the disclosure below, simply by way of illustration of the best mode contemplated for carrying out the invention. As will be realized, the invention is capable of other and different embodiments, and its several details are capable of modifications in various respects, all without departing from the invention. Accordingly, the drawings and description are to be regarded as illustrative in nature, and not as restrictive.

FIGS. 1A–1F represent a fabrication sequence for a simple structure which may be formed using the concepts disclosed in the present invention in which a gate structure is formed upon a substrate assembly. The term substrate assembly is intended herein to mean a substrate having one or more layers or structures formed thereon. As such, the substrate assembly may be, by way of example and not by way of limitation, a doped silicon semiconductor substrate typical of a semiconductor wafer.

Figure 1A:
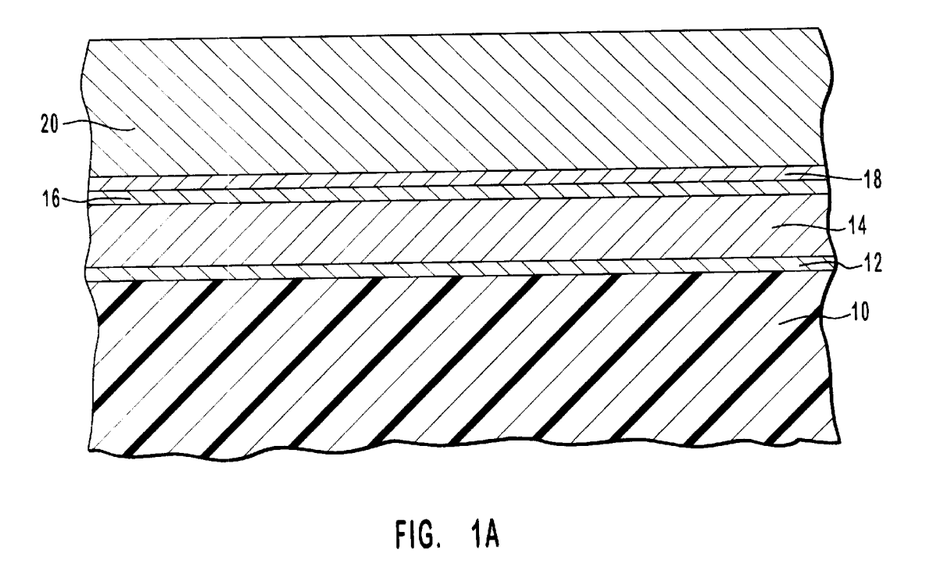
FIGS. 1A–1F are a sequence of cross-sectional views of a simple non-planar polysilicon structure, illustrating the development of the polysilicon structure, as it progresses through fabrication steps described below.

In FIG. 1A, a first silicon layer 14 is deposited on top of a base insulation layer 12 on a silicon substrate 10 of a semiconductor wafer. Base insulation layer 12 is typically an oxide layer grown directly from a base silicon substrate material on silicon substrate 10, although base insulation layer 12 could also be a deposited oxide layer and the base silicon substrate material on silicon substrate 10 could also be an epitaxial silicon layer or region. Preferably, base insulation layer 12 will have a thickness in a range from about 40 Angstroms to about 150 Angstroms, and preferably from about 90 Angstroms to about 100 Angstroms. First silicon layer 14 could be either polysilicon or amorphous silicon and its composition would depend on other device and process factors. First silicon layer 14 will typically be deposited by a sputtering or chemical vapor deposition (CVD) process and has a preferred thickness of about 1500 Angstroms.

First refractory metal layer 16 is then deposited on silicon substrate 10 of the semiconductor wafer on top of first silicon layer 14, First refractory metal layer 16 will typically be titanium silicide although other refractory metal suicides could be used, and will typically be deposited by a CVD process. First barrier layer 18 is then deposited on silicon substrate 10 of the semiconductor wafer on top of first refractory metal layer 16. First barrier layer 18 will typically be a passivation or insulating material which is readily deposited such as silicon dioxide or silicon nitride, although other materials could be used. Second silicon layer 20 is then deposited on silicon substrate 10 of the semiconductor wafer on top of first barrier layer 18. Second silicon layer 20 could be either polysilicon or amorphous silicon and its composition would depend on other device and process factors. Second silicon layer 20 will typically be deposited by a sputtering or (CVD) process and has a preferred thickness in a range from about 4000 Angstroms to about 5000 Angstroms.

Figure 1B:
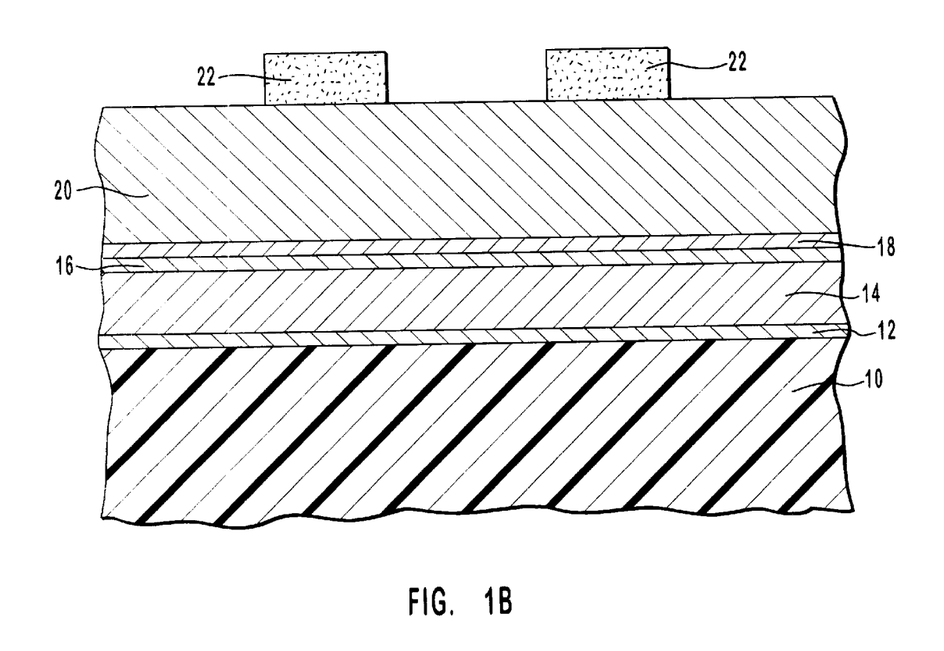
Figure 1C:
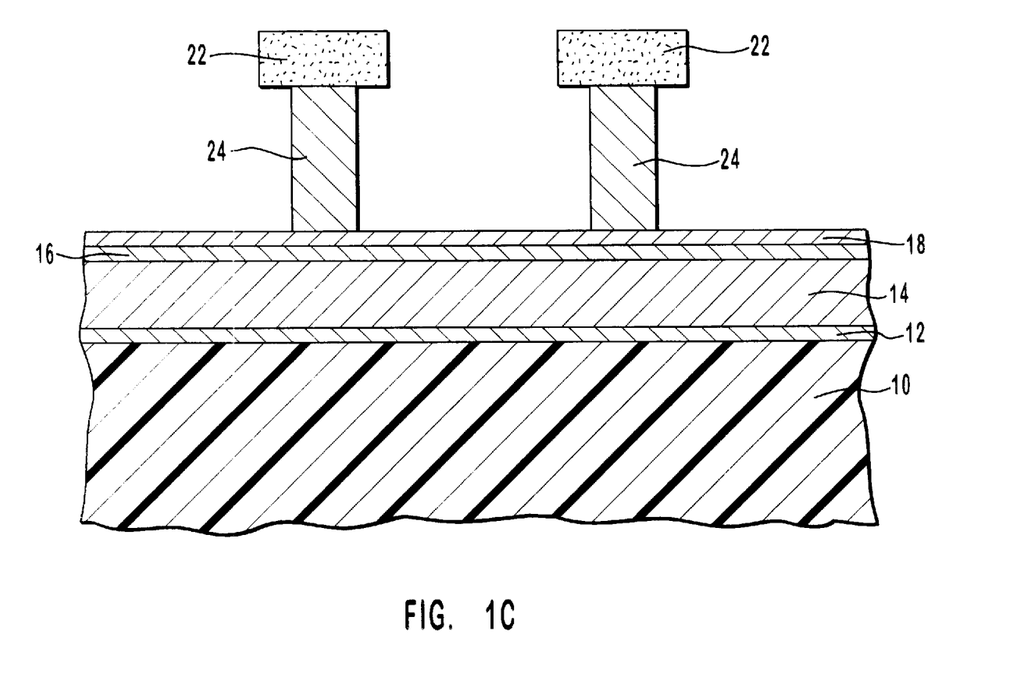
Figure 1D:
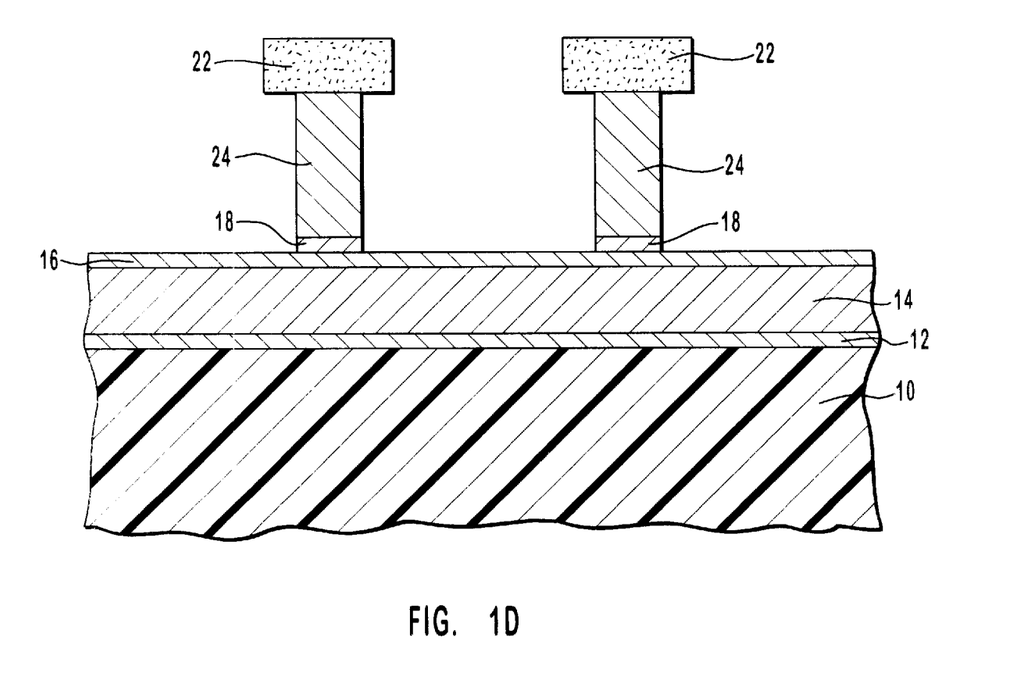

The semiconductor wafer is then patterned with a photoresist material 22 on top of second silicon layer 20 as shown in FIG. 1B. An etch step is then performed to etch second silicon layer 20 leaving silicon riser structures 24 as shown in FIG. 1C. Silicon riser structures 24 serve as a mask for first barrier layer 18 during the etch. Thus first barrier layer 18 remains only under silicon riser structures 24 as shown in FIG. 1D.

Figure 1E:
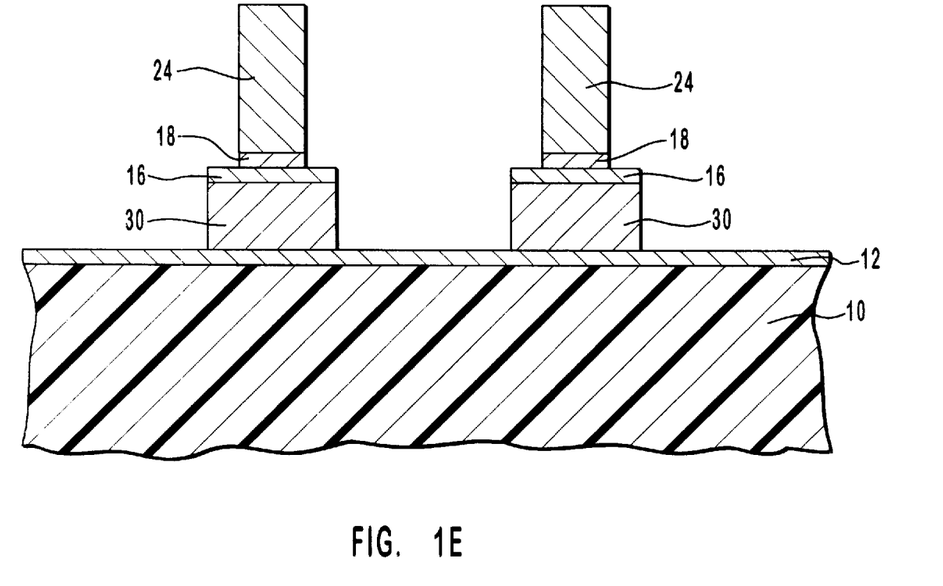

A second etch is then performed, etching first refractory metal layer 16 and first silicon layer 14. After photoresist material 22 is stripped, there remains complex gate structures 32 which include base polysilicon regions 30 and silicon riser structures 24 as shown in FIG. 1E.

Figure 1F:
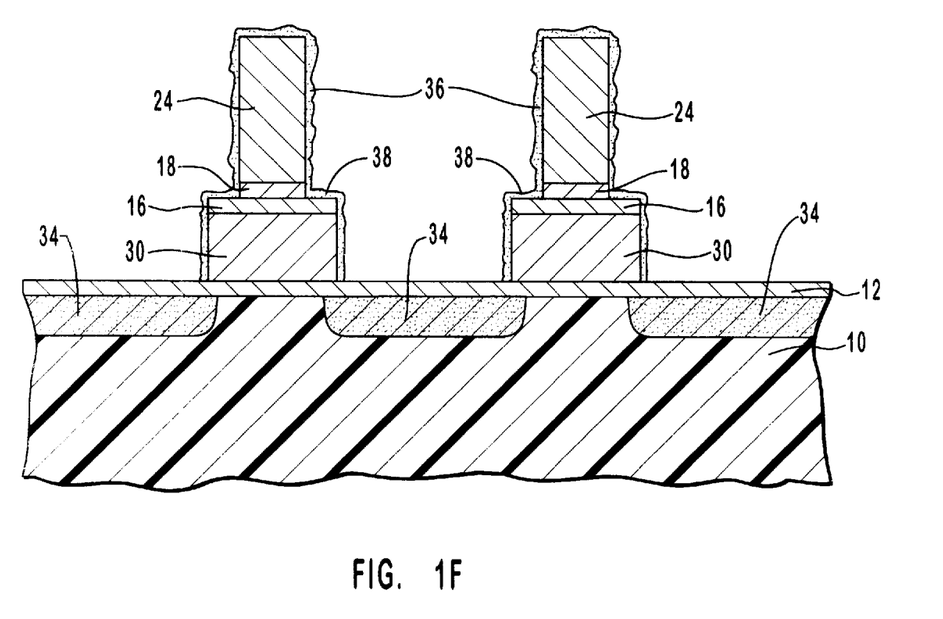

An implantation step is then performed, creating the doped source/drain regions 34 in silicon substrate 10. A second refractory metal layer 36 is then deposited on the semiconductor wafer as shown in FIG. 1F. The deposition will typically be either by sputtering or by (CVD) processes. CVD achieves better coverage of exposed surfaces which are substantially vertical, such as inner vertical walls of silicon riser structures 24 and is preferred. Second refractory metal layer 36 is composed of pure titanium in the preferred a embodiment although other refractory metals such as cobalt, or their stoichiometric suicides, could also be used.

One or more high temperature annealing steps will then be performed so that the material in first refractory metal layer 24 and second refractory metal layer 36 reacts with the polysilicon material in silicon riser structures 24 and base polysilicon regions 30 to form polycide. Material from refractory metal layer 36 that is unreacted with exposed silicon on the semiconductor wafer is then removed using a conventional etching process so that the complex gate structures 32 now appear as shown in FIG. 1F. Temperatures during the high temperature annealing steps will be in a range from about 700° C. to about 1100° C. and will vary based on other device fabrication factors. In the preferred embodiment, the temperature chosen is sufficient to transform the titanium silicide formed into the C54 crystalline phase.

First barrier layer 18 is seen in FIG. 1F as having second refractory metal layer 36 thereon at area 38. Area 38 is covered by second refractory metal layer 36 due to a phenomena know as creep. By way of example of this phenomena, as silicon mixes with the refractory metal with heightened temperature, the reaction product thereof is a refractory metal silicide that tends to grow. Seen in FIG. 1F, second refractory metal layer 36 has grown over area 38 of first barrier layer 18, and thereafter serves as a bridge for second refractory metal layer 36 between first refractory metal layer 16 and silicon riser structure 24. As such, second refractory metal layer 36 serves as a conductive strapping of the illustrated structures seen in FIG. 1F from top to bottom. The strapping arrangement increases the conductive surface area with a low resistivity layer on the resultant structures.

It will be obvious to those skilled in the art that other processing steps not disclosed here may be added which would have created regions of exposed silicon, as would be done by patterning base insulation layer 12 to create exposed regions on silicon substrate 10 of the semiconductor wafer 10. In this event, the high temperature annealing steps would also cause regions of refractory metal layer 36 to react with the other silicon contact regions to form additional silicided regions or structures. Fabrication methods which include the additional silicided regions or structures should be considered a part of this invention.

The technique shown in FIGS. 1A though IF is particularly advantageous for forming a width of base polysilicon region 30 less than 0.25 microns. By creating complex polysilicon structures with increased surface area, the resistance of said structures is greatly reduced. Polysilicon structures, such as silicon riser structure 24, can be integrated into fabrication of a Dynamic Random Access (DRAM) device. By way of example, and not by way of limitation, the riser structures contemplated by the present invention can be used in the formation of either a storage node component or a cell plate component of a capacitor structure found in a DRAM device. As such, the riser structure will add surface area to the capacitor so as to realize added charge strength and less time between refresh charging.

Figure 2A:
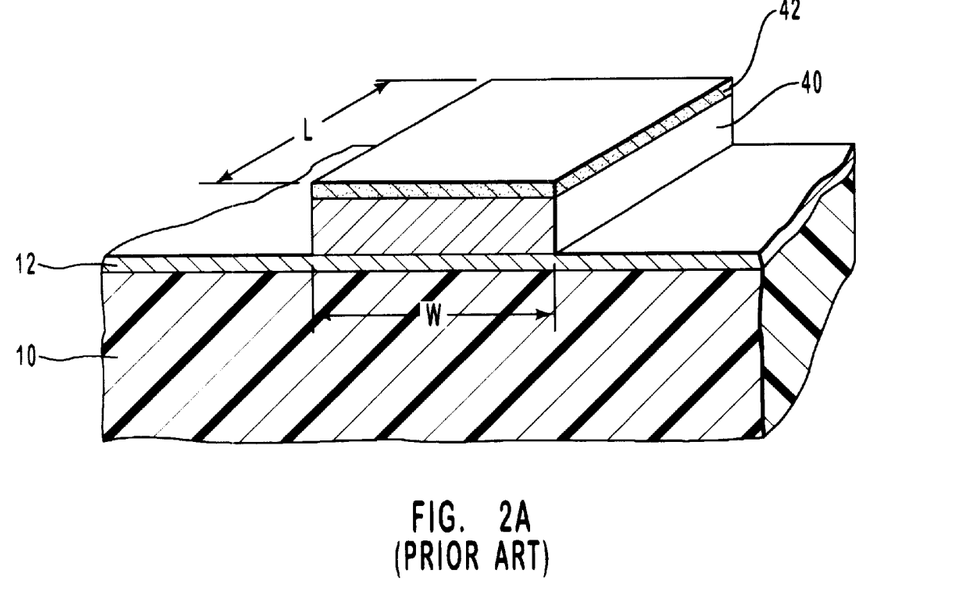
FIGS. 2A–2B depicts perspective views that illustrate a principle of the invention described herein by which the effective conductive surface area of the polysilicon structure is increased.
Figure 2B:
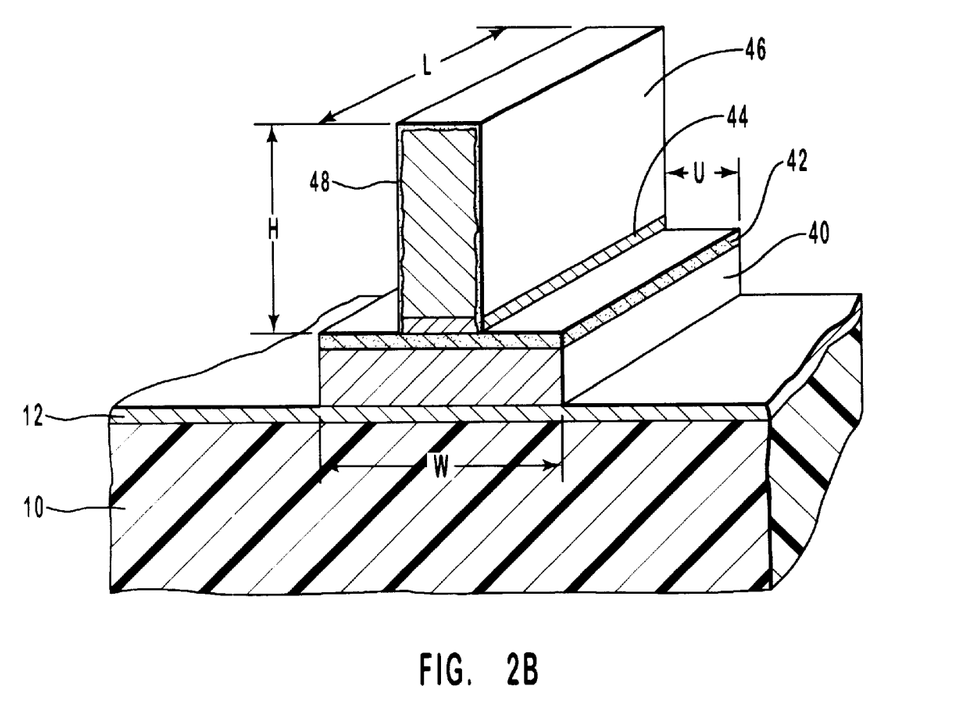

FIGS. 2A–2B are three dimensional cross-section drawings which illustrate the difference in surface areas between a conventional polycide gate structure as shown in FIG. 2A and the complex gate structure which is described herein and is shown in FIG. 2B. It is known in the art that an end-to-end resistance of a rectangular piece of conductive material is directly proportional to the number of squares of the material, said number of squares being a unitless quantity defined as:

S=L/W, where

L=the end to end length of said conductive material, and

W=the width of said conductive material.

Applying this formula to a simple polysilicon structure 40 in FIG. 2A, those skilled in the art will further observe that, for typical polysilicon MOS transistor structures, the end-to-end resistance of simple polysilicon structure 40 is primarily determined by the material composition and the thickness of base silicide layer 42 along the surface of simple polysilicon structure 40. This is due to the fact that the resistivity of base silicide layer 42 is substantially less than that of the rest of the polysilicon material which comprises simple polysilicon structure 40. As it is now intended to show that the surface geometry of a complex polysilicon structure 44 in FIG. 2B provides for a lower end-to-end resistance than does the surface geometry of simple polysilicon structure 40 shown in FIG. 2A, it will be assumed that base silicide layer 42 covering the surface of simple polysilicon structure 40 is identical in thickness and in material composition to a riser silicide layer 48 which covers the exposed surfaces of riser polysilicon structure 46.

The total width of simple polysilicon structure 40 as shown in FIG. 2A is equal to:

Wsimple=W

Therefore the number of squares of simple polysilicon structure 40 is equal to:

Ssimple=L/W  (1)

The total width of complex polysilicon structure 44, however, is determined by the combination of the surface of simple polysilicon structure 40 and riser polysilicon structure 48 and is equal to:

Wcomplex=W+2*H+(W−2*U)

which can be rewritten as:

Wcomplex=2*(W+H−U)

Therefore the number of squares of complex polysilicon structure 44 is equal to:

Scomplex=L/(2*(W+H−U))  (2)

The ratio between the number of squares for the simple and complex geometries can be stated by dividing equation (2) by equation (1) which results in:

Scomplex/Ssimple=W/(2*(W+H+U))  (3)

Applying this relationship to a submicron gate geometry which can be developed using the invention described herein, typical values for W, H and U would be:

W=0.25 μ H=0.5 μ U=0.05 μ

Substituting these values into equation (3) yields the relationship:

Scomplex=0.18*Ssimple

Since the end-to-end resistance is directly proportional to the number of squares, the above calculations demonstrate that an 82% reduction in gate resistance is achievable by using the invention described herein. The percentage of reduction in gate resistance is a function of H, which can be varied according to design. An H lower than 0.5μ, such as 0.25μ, would help to reduce the height of the structure extending from the substrate assembly. In can be generally summarized that any three dimensional shape which incorporates the inventive surface area increasing aspects of the present invention will also accomplish related improvements.

While the embodiment described above and illustrated in FIGS. 1A–1F and FIGS. 2A–2B best illustrates the basic principle of the invention described herein, FIGS. 3A–3I illustrate an alternative embodiment of the present invention which is adapted to the fabrication of polysilicon MOSFET gate structures and which will now be described.

Figure 3A:
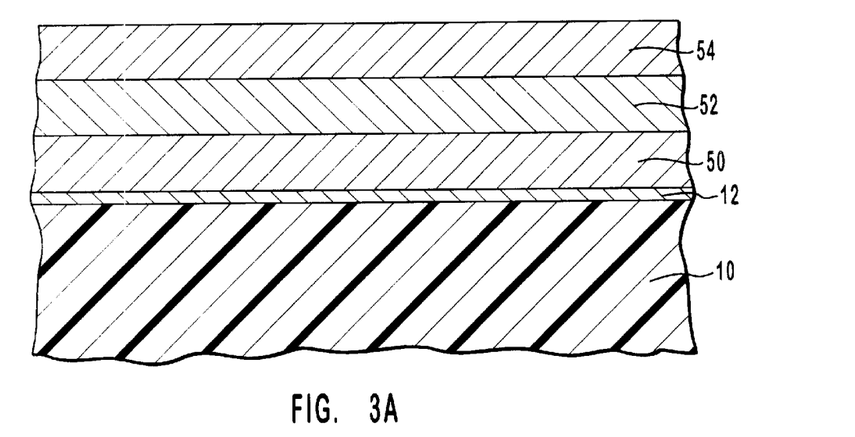
FIGS. 3A–3I are a sequence of cross-sectional views of a preferred embodiment of the novel transistor structure of the invention described herein, illustrating the development of the novel transistor structure, as it progresses through the fabrication steps described below.

In FIG. 3A a nitride layer 50 is deposited on top of a gate oxide layer 12 of a is silicon substrate 10 of a semiconductor wafer. Gate oxide layer 12 is typically an oxide layer grown directly on base silicon substrate material of silicon substrate 10, although gate oxide layer 12 could also be a deposited oxide layer, and the base silicon substrate material of silicon substrate 10 could be an epitaxial silicon layer. A nitride layer 50 is typically deposited by a CVD process and in this embodiment is substantially composed of silicon nitride, although other materials could be used.

A second oxide layer 52 is then deposited on the semiconductor wafer on top of nitride layer 50. In this embodiment, second oxide layer 52 is typically deposited by a CVD process and is substantially composed of silicon dioxide, although other materials could be used.

A first silicon layer 54 is then deposited on the semiconductor wafer on top of second oxide layer 52. First silicon layer 54 could be either polysilicon or amorphous silicon and its composition would depend on other device and process factors First silicon layer 54 is typically deposited by a sputtering or chemical vapor deposition (CVD) process and has a thickness of about 1500 Angstroms.

Figure 3B:
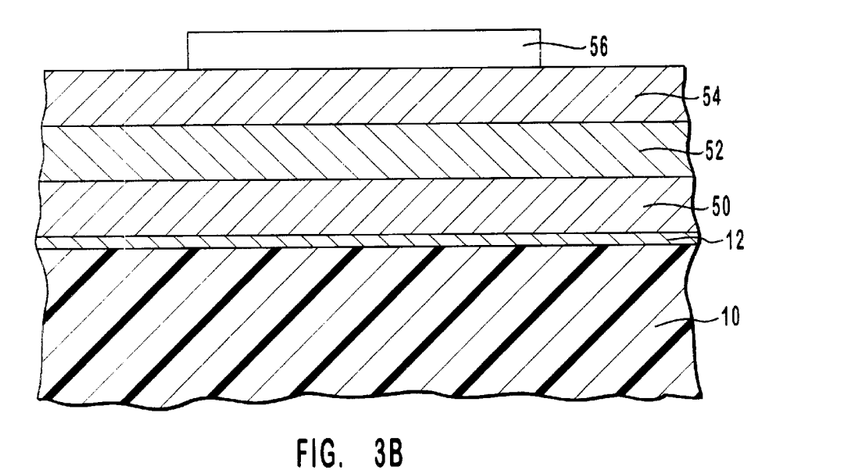
Figure 3C:
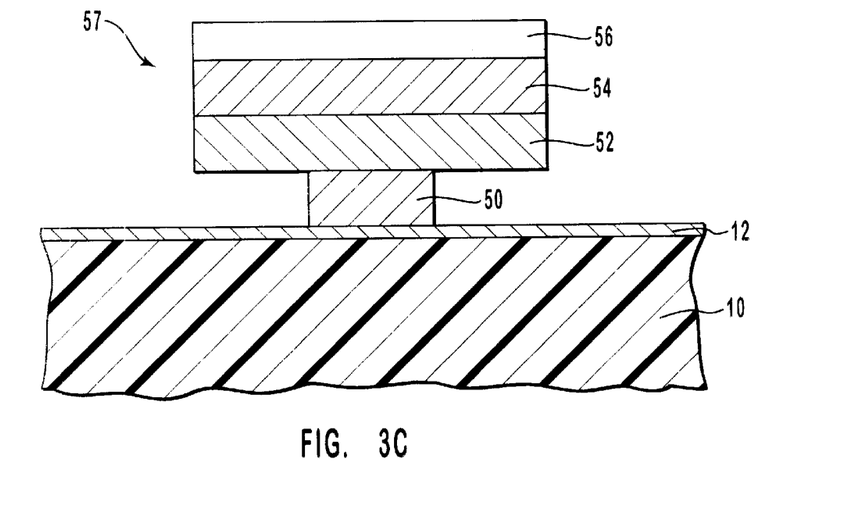

The semiconductor wafer is then patterned as shown in FIG. 3B with a photoresist layer 56 and material from nitride layer 50, second oxide layer 52 and first silicon layer 54 is removed, leaving a gate stack 57 as shown in FIG. 3C. The etching is performed so that nitride layer 50 is undercut. The undercut of nitride layer 50, on each side thereof illustrated in FIG. 3C is preferably about 0.15 microns, leaving the remaining illustrated length of nitride layer 50 preferably about 0.3 microns.

Figure 3D:
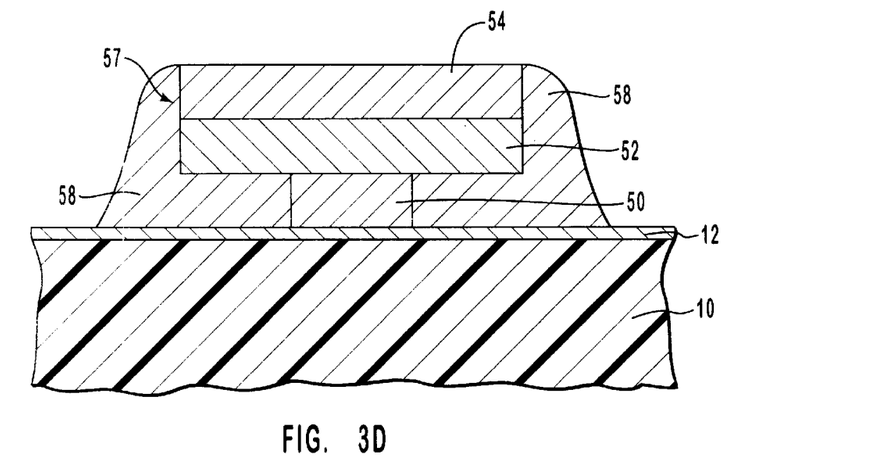

A second silicon layer 58 is then deposited on the semiconductor wafer as shown in FIG. 3D. Second silicon layer 58 will preferably be deposited with a CVD process so that the aforedescribed undercut areas of nitride layer 50 are filled with second silicon layer 58. Second silicon layer 58 must also be deposited in such a manner that spacers can be formed on either side of gate stack 57 in a subsequent spacer etch of second silicon layer 58. As such, second silicon layer 58 makes conductive contact with the vertical sides of first silicon layer 54, so that a single complex polysilicon gate structure is formed.

Figure 3E:
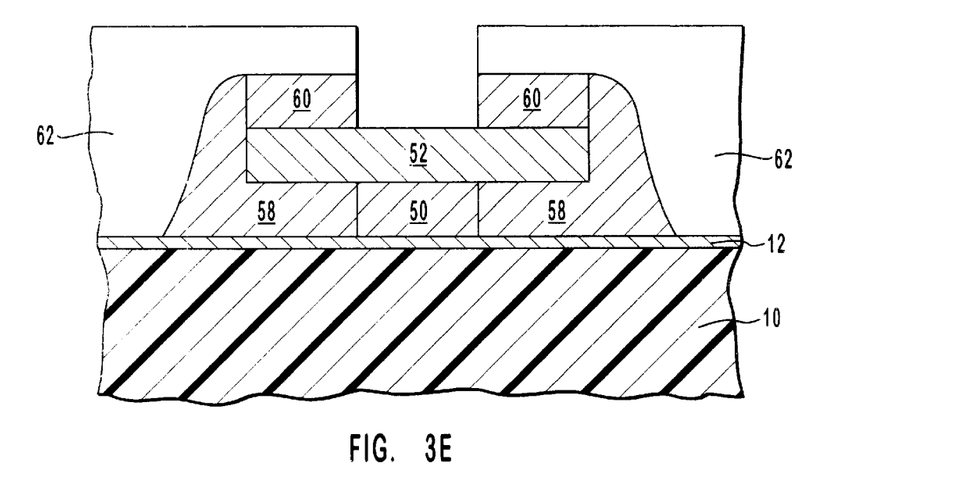

The semiconductor wafer is then patterned and anisotropically etched so that material is removed from first silicon layer 54 leaving silicon gate structures 60 and a gate well 62 as shown in FIG. 3E. A second etch, which is isotropic, is performed to remove the remaining material of second oxide layer 52 from within gate stack 57. The second etch is preferably an oxide etch that is carried out using nitride layer 50 ;s an etch stop. As such, all material in second oxide layer 52 within gate stack 57 is substantially removed, leaving only nitride layer 50. A third etch is performed to remove the remaining material of nitride layer 50 from within gate stack 57. The third etch is preferably an nitride etch that is carried out using gate oxide layer 12 as an etch stop. As such, all material in nitride layer 50 within gate stack 57 is substantially removed. Additional processing steps provide for patterning and etching of gate oxide layer 12 to expose regions of silicon substrate 10 to provide for source/drain contact regions 66. Additional processing steps further provide for the implantation of dopant material into source/drain contact regions 66 of silicon substrate 10. Implementation of said additional processing steps, however, are conventional and need not be further detailed herein. The forgoing etch process forms first and second gate tops 61 and first and second gate bottoms 63.

Figure 3F:
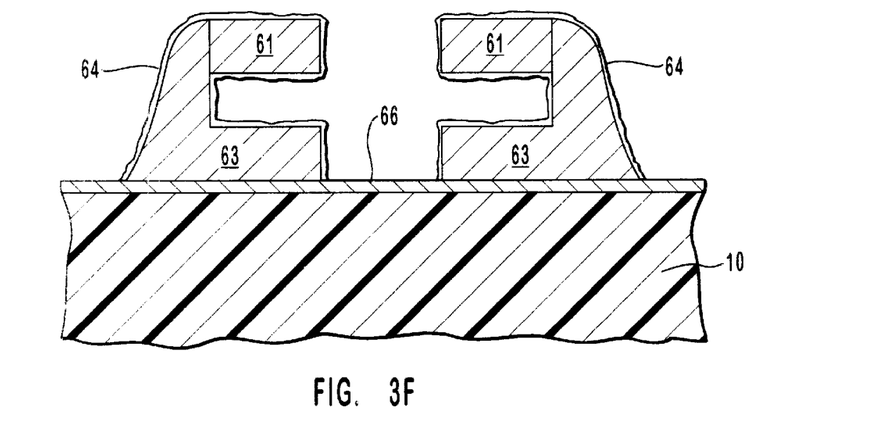

Refractory metal layer 64, such as titanium, is then deposited on the semiconductor wafer as shown in FIG. 3F. In this embodiment refractory metal layer 64 is pure titanium and is deposited using chemical vapor deposition (CVD). CVD obtains a preferred coverage on the underside of first silicon layer 54 on the inside surface of silicon gate structures 60, thereby increasing the surface area of interfacing between refractory metal layer 64 and silicon surfaces.

One or more high temperature annealing steps will then be performed so that the material in refractory metal layer 64 reacts with the silicon in silicon gate structures 60 and in source/drain contact regions 66 to form a polycide layer. Temperatures during the high temperature annealing steps will be in a range from about 700° C. to about 1100° C. and will vary based on other device fabrication factors. In this embodiment, titanium will be the material from which refractory metal layer 64 is composed. The temperature will be preferably sufficient to transform the titanium silicide formed from the reaction of refractory metal layer 64 with silicon gate structures 60 and so as to form the C54 crystalline phase upon both silicon gate structures 63.

Figure 3G:
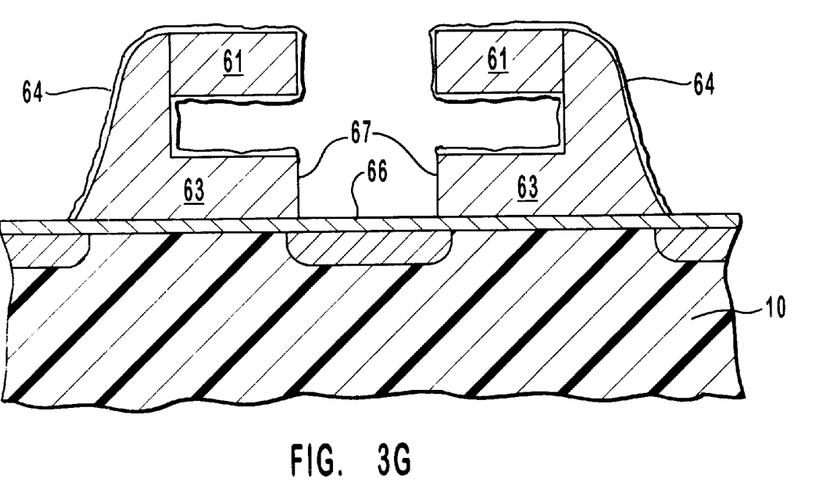

Material from refractory metal layer 64 that is unreacted with exposed silicon on the semiconductor wafer is then removed using an conventional etching process leaving a structure as is illustrated in FIG. 3G. Additionally, it may be preferably to remove refractory metal silicide material from surfaces 67 on silicon gate structures 63.

Figure 3H:
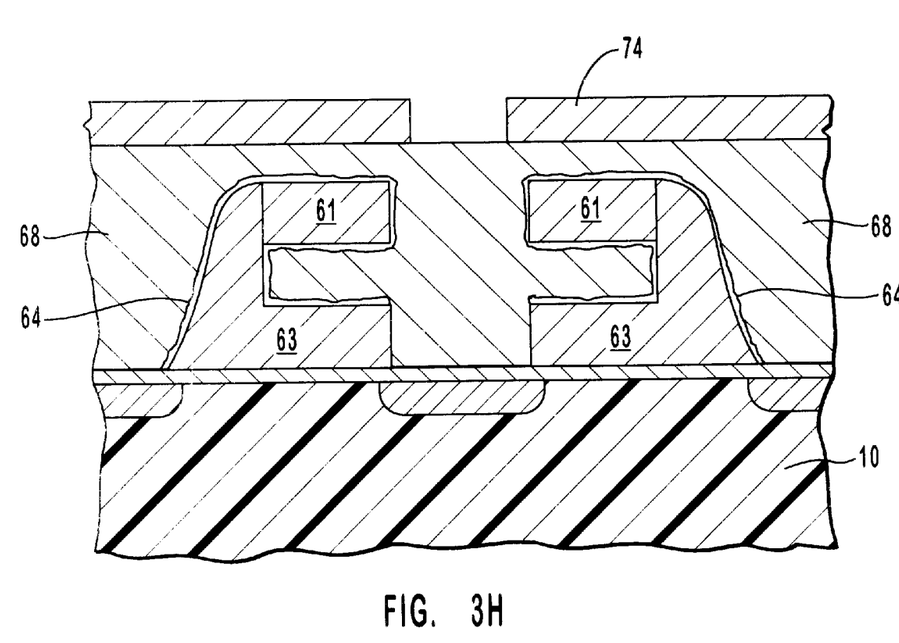
Figure 3I:
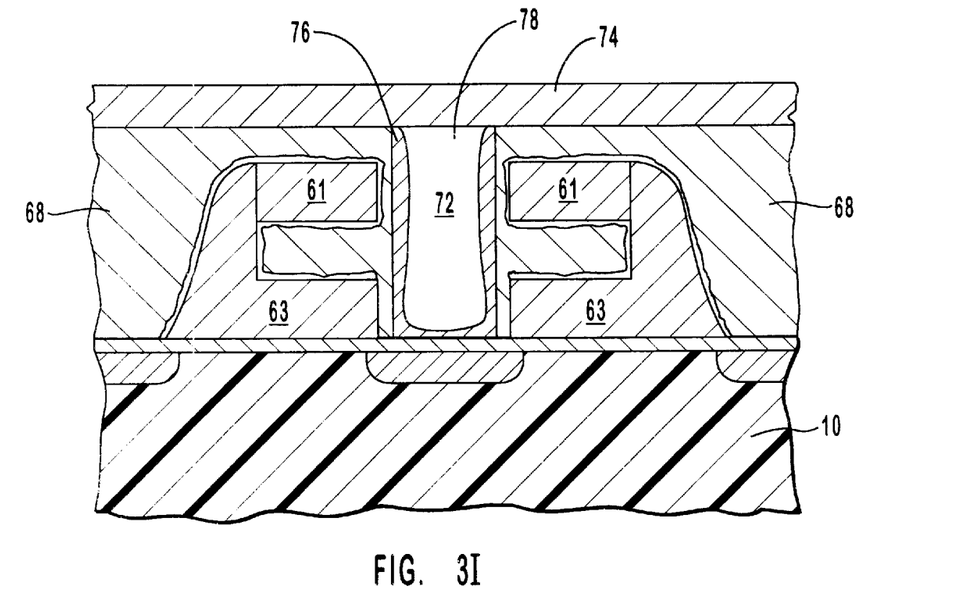

A first passivation layer 68 is then deposited on the semiconductor wafer as shown in FIG. 3H. First passivation layer 68 is typically a material such as BPSG. The semiconductor wafer is then patterned with photoresist layer 74 and etched to form a contact plug region 72 as shown in FIG. 3I. A titanium/titanium nitride liner 76 is then formed on the inside surfaces of contact plug region 72. A tungsten silicide contact plug 78 is then formed within the inside surfaces of titanium/titanium nitride liner 76 within contact plug region 72. Seen in 3I is a contact made by titanium/titanium nitride liner 76 with gate oxide layer 12 above source/drain region 66 which is between the two silicon gate structures 60. A metal layer 74 is then formed, incident to a metalization process, on top of first passivation layer 68 making conductive contact with the tungsten silicide contact plug. FIG. 3I shows that first and second gate tops 61 and first and second gate bottoms 63, in combination, have cross-sectional shapes of a "C" or inverted "C".

Figure 4A:
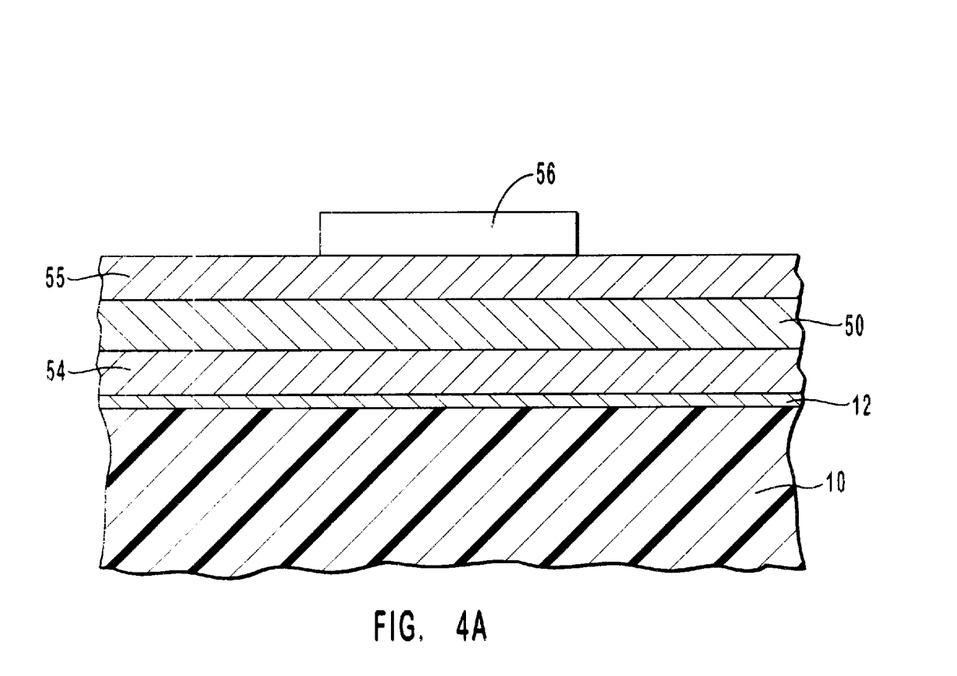
FIGS. 4A–4C are a sequence of cross sectional views of an alternate embodiment of the novel transistor structure of the invention described herein, illustrating the development thereof as it progresses through the fabrication steps described below.

In FIG. 4A, a first silicon layer 54 is formed on top of a gate oxide layer 12 of a silicon substrate 10 of a semiconductor wafer. Gate oxide layer 12 is typically an oxide layer grown directly on base silicon substrate material of silicon substrate 10, although gate oxide layer 12 could also be a deposited oxide layer, and the base silicon substrate material of silicon substrate 10 could be an epitaxial silicon layer. A nitride layer 50 is formed on top of second oxide layer 54, typically being deposited by a CVD process. In this embodiment, nitride layer 50 is preferably composed of an electrical insulator such as silica or silicon nitride, although other materials could be used.

A second silicon layer 55 is then formed on top of nitride layer 50. First and second silicon layers 54, 55 could be either polysilicon or amorphous silicon and its composition would depend on other device and process factors. First and second silicon layers 54, 55 are typically deposited by a sputtering or chemical vapor deposition (CVD) processes. The thickness of first silicon layer 54 is in a range from about 800 Angstroms to about 1500 Angstroms, and is preferably about 1500 Angstroms thick. The thickness of second silicon layer 55 is in a range from about 1000 Angstroms to about 2000 Angstroms, and is preferably about 2000 Angstroms thick.

Figure 4B:
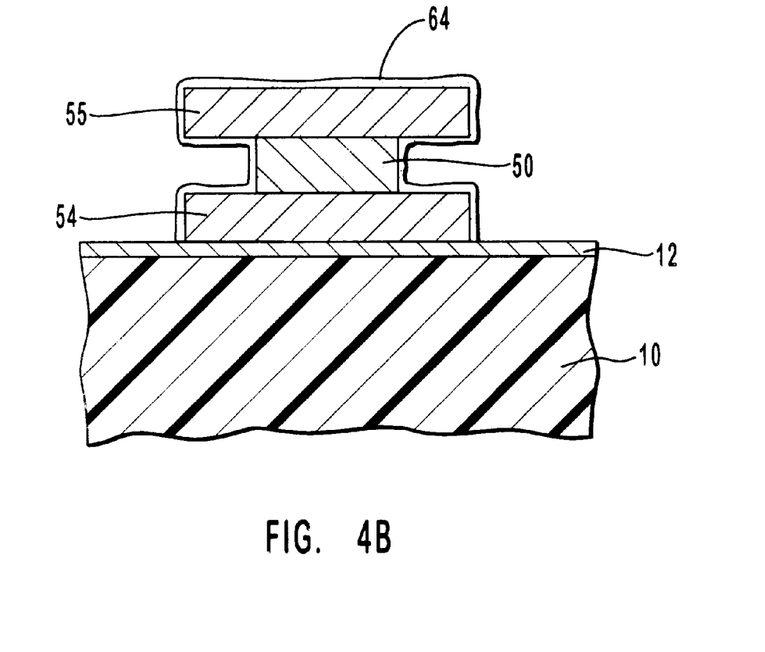

The semiconductor wafer is then patterned as shown in FIG. 3A with a photoresist layer 56, and then subjected to an etching process. The result of the etching process is seen in FIG. 4B, where material from nitride layer 50, and material from first and second silicon layers 54, 55 are removed. The etching process is performed so that nitride layer 50 is undercut. The undercut of nitride layer 50, on each side thereof illustrated in FIG. 4B is preferably in a range from about 0.05 microns to about 0.1 microns, leaving the remaining illustrated length of nitride layer 50 preferably in a range from about 0.05 microns to about 0.15 microns.

Refractory metal layer 64, such as titanium, is then deposited on the semiconductor wafer as shown in FIG. 4B. In this embodiment, refractory metal layer 64 is pure titanium and is deposited using chemical vapor deposition (CVD). CVD obtains a preferred coverage on the underside of second silicon layer 55, thereby increasing the surface area of interfacing between refractory metal layer 64 and silicon surfaces. Additionally, the undercut regions of nitride layer 50 are also coated the CVD deposited refractory metal layer 64.

One or more high temperature annealing steps will then be performed so that the material in refractory metal layer 64 reacts with exposed silicon surfaces. Temperatures during the high temperature annealing steps will be in a range from about 550° C. to about 1100° C. and will vary based on other device fabrication factors. In this embodiment, titanium will be the material from which refractory metal layer 64 is composed. The temperature will be preferably sufficient to transform the titanium silicide formed from the reaction of refractory metal layer 64 with silicon surfaces so as to form the C54 crystalline phase upon the silicon surfaces.

Material from refractory metal layer 64 that is unreacted with exposed silicon on the semiconductor wafer is then removed using an conventional etching process leaving a structure as is illustrated in FIG. 4B. FIG. 4B also shows nitride layer 50 has being coated at the undercut regions thereof by a refractory metal silicide of refractory metal layer 64. Such coating is due to the creep phenomena described above. As such, refractory metal layer 64 serves as a conductive strapping between first and second silicon layers 54, 55. The strapping arrangement increases the conductive surface area with a low resistivity layer on the resultant structure.

Figure 4C:
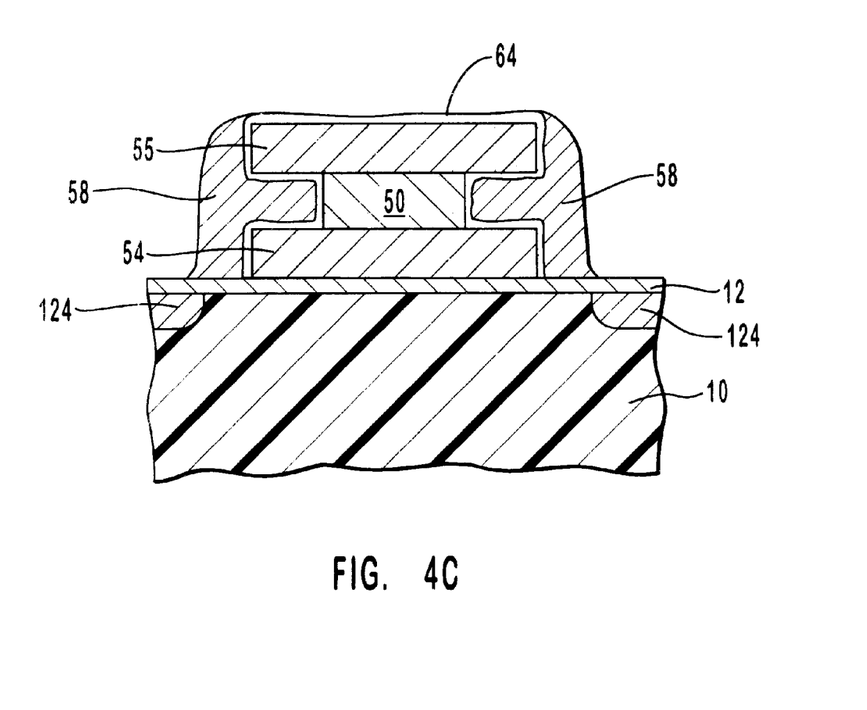

A third silicon layer 58 is then deposited on the semiconductor wafer as shown in FIG. 4C. Third silicon layer 58 will preferably be deposited with a CVD process so that the aforedescribed undercut areas of nitride layer 50 are filled with third silicon layer 58. Third silicon layer 58 must also be deposited in such a manner that spacers can be formed on either side of first and second silicon layers 54, 55 in a subsequent spacer etch of third silicon layer 58. As such, third silicon layer 58 makes conductive contact with the vertical sides of first and second silicon layers 54, 55 so that a single complex polysilicon gate structure is formed. Source and drain regions may then be conventionally formed within silicon substrate 10. FIG. 4C shows an "I" shape in cross-section from the combination of first and second silicon layers 54, 55 with nitride layer 50.

Figure 5:
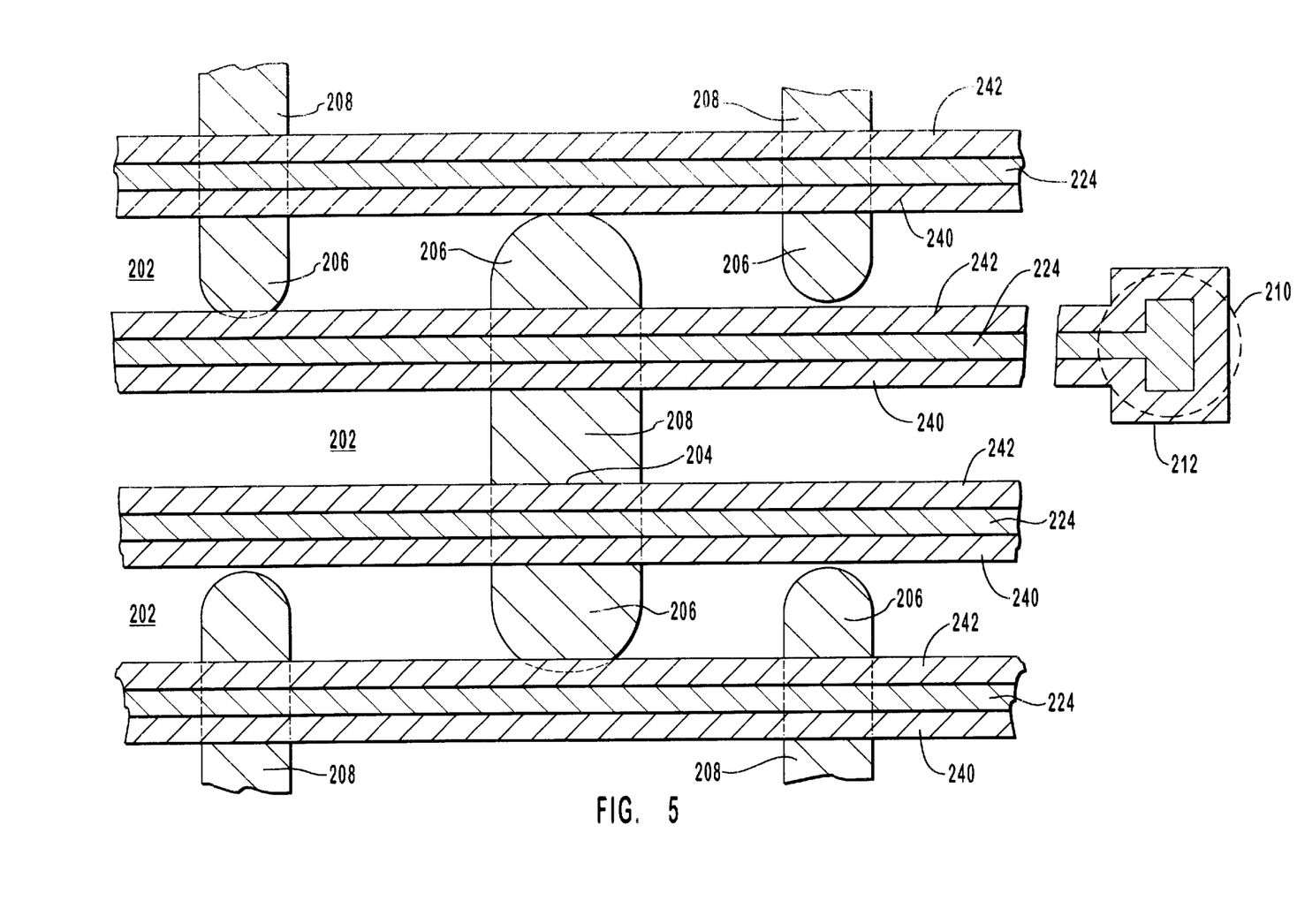
FIG. 5 is a top planar view of a DRAM device with a folded bit line architecture having alternating columns of islands, and therein depicting field oxide regions, access transistor gates, storage nodes, active areas, digit nodes, and a contact, wherein the wordlines depicted are formed according to the inventive methods and have both transistor gate structures and parasitic field devices.

FIG. 5 illustrates a top planar view of DRAM structure showing a folded bit line architecture having alternating columns of islands. Seen in FIG. 5 are field oxide regions 202, access transistor gates 204, storage nodes and active areas 206, digit nodes 208, and a contact seen in phantom at 210 at cutaway regions 212. The wordlines see in FIG. 5 are formed according to the inventive methods disclosed herein and have both transistor gate structures and parasitic field devices. Each wordline in FIG. 5 is situated on a substrate assembly and is parallel to other wordlines thereon. By way of example, and not by way of limitation, complex gate structure 32 which includes base polysilicon region 30 and silicon riser structure 24 as shown in FIG. 1E can be depicted in top view thereof in FIG. 5. Particularly, the widest portion of base polysilicon region 30 seen n FIG. 1F is seen as a word line width extending between 240 and 242 in FIG. 5. Also, silicon riser structure 24 as shown in FIG. 1E can be generally depicted at 224 in FIG. 5. As such, each wordline depicted in FIG. 5 can incorporate a structural component having a cross-sectional shape of a "C" or inverted "C" seen in FIG. 3I, or an "I" shape seen in FIG. 4C.

The structures described above can be integrated into the fabrication of a variety of memory devices, including SRAM, logic memory, flash memory, and DRAM. Such integration can include both wordline gate structures and three dimensional capacitor structures, such as storage node and cell plate capacitor components. By creating the polycide DRAM wordline structures descibed above, or such structures integrated into the fabrication of other memory devices, where each such structure has a complex silicided gate surface, the overall resistivity of the wordline structure is optimized, as is the surface area optimized, each benefit of which contributes to an enhancement of device performance and speed.

The present invention may also be embodied in other specific forms without departing from its spirit or essential characteristics. The described embodiments are to be considered in all respects only as illustrated and not restrictive. The scope of the invention is, therefore, indicated by the appended claims rather than by the foregoing description. All changes which come within the meaning and range of equivalency of the claims are to be embraced within their scope.

What is claimed and desired to be secured by United States Letters Patent is:

1. A method of making a gate structure on a substrate assembly comprising:

forming a gate oxide layer on a substrate assembly;

forming a first silicon layer on the gate oxide layer;

forming a first refractory metal silicide layer on the first silicon layer;

forming a first electrically insulating layer on the first refractory metal silicide layer;

forming a second silicon layer on the first electrically insulating layer;

forming a silicon riser, the silicon riser having a riser silicon layer that is a portion of the second silicon layer and a riser oxide layer that is a portion of the first electrically insulting layer, the silicon riser having exposed surfaces including a top surface thereon and a width;

forming a lower gate stack having a lower gate refractory metal silicide layer that is a portion of the first refractory metal silicide layer and a lower gate silicon layer that is a portion of the first silicon layer, the silicon riser projecting from the lower gate stack away from the substrate assembly, said lower gate stack having a width greater than the width of the silicon riser; and forming a second refractory metal silicide layer substantially covering exposed surfaces of the silicon riser including the top surface and contacting the lower gate refractory metal silicide layer such that the first refractory metal silicide with the second refractory metal silicide surround the silicon riser.

2. A method of making a gate structures on a substrate assembly as defined in claim 1, further comprising forming an active region within the substrate assembly below the gate oxide layer extending on the substrate assembly adjacent to said lower gate stack.

3. A method of making a gate structure on a substrate assembly as defined in claim 1, wherein each of said lower gate stack and said silicon riser has a substantially rectangular cross-section, the width of the rectangular cross-section of the lower gate stack being greater than the width of the rectangular cross-section of the silicon riser; wherein each of the lower gate stack and the silicon riser has a thickness that is substantially the same and equal to L, the width of the cross-section of the lower gate stack is equal to W, the height of the rectangular cross-section of the silicon riser is equal to H, and the width of the cross-section of the silicon riser is equal to W−(2*U), and wherein the combined end-to-end electrical resistance of the first and second refractory metal silicide layers respectively on the lower gate stack and the silicon riser is equal to $L/(2*(W+H-U))$.

4. A method of making a gate structure on a substrate assembly as defined in claim 1, wherein forming a silicon riser comprises:

selectively removing material from the second silicon layer; and removing material from the first electrically insulating layer.

5. A method of making a gate structure on a substrate assembly as defined in claim 1, wherein forming a lower gate stack comprises selectively removing material from the first refractory metal silicide layer and the first silicon layer to form the lower gate stack.

6. A method of making a gate structure on a substrate assembly as defined in claim 1, wherein forming a second refractory metal silicide layer substantially covering exposed surfaces of the silicon riser including the top surface and contacting the lower gate refractory metal silicide layer comprises:

forming a refractory metal layer upon the exposed surfaces of the silicon riser;

heating the substrate assembly sufficient to substantially react the riser silicon layer with the refractory metal layer and thereby form said second refractory metal silicide layer; and removing substantially all of the unreacted refractory metal of the refractory metal layer upon the silicon riser.

7. A method of making a gate structure on a substrate assembly as defined in claim 6, wherein the refractory metal layer is substantially composed of titanium.

8. A method of making a gate structure on a substrate assembly as defined in claim 1, wherein the first and second refractory metal silicide layers are substantially composed of $TiSi_x$.

9. A method of making a gate structure on a substrate assembly as defined in claim 8, wherein x is equal to 2.

10. A method of making a gate structure on a substrate assembly as defined in claim 1, wherein at least one of the first and second silicon layers are substantially composed of polysilcon.

11. A method of making a gate structure on a substrate assembly as defined in claim 1, wherein at least one of the first and second silicon layers is substantially composed of amorphous silicon.

12. A method of making a gate structure on a substrate assembly as defined in claim 1, wherein the first electrically insulating layer is substantially composed of a material selected from a group consisting of silica and silicon nitride.

13. A method of making a gate structure on a substrate assembly as defined in claim 1, wherein:

forming a silicon riser comprises forming a plurality of silicon risers, each of said plurality of silicon risers having a riser silicon layer that is a portion of the second silicon layer and a riser oxide layer that is a portion of the first electrically insulating layer, the silicon riser having exposed surfaces including a top surface thereon and a width;

forming a lower gate stack comprises forming a plurality of lower gate stacks, each of said plurality of lower gate stacks having a lower gate refractory metal silicide layer that is a portion of the first refractory metal silicide layer and a lower gate silicon layer that is a portion of the first silicon layer;

each said silicon riser of said plurality of silicon risers projecting from a respective lower gate stack away from the substrate assembly, each said lower gate stack of said plurality of lower gate stacks having a width greater than the width of the silicon riser projecting therefrom; and forming a second refractory metal silicide layer comprises substantially covering the exposed surfaces of each said silicon riser of said plurality of silicon risers including the top surface so as to contact the lower gate refractory metal silicide layer of a respective lower gate stack of said plurality of lower gate stacks such that the first refractory metal silicide with the second refractory metal silicide surround each said silicon riser of said plurality of silicon risers.

14. A method of making a gate structure on a substrate assembly as defined in claim 13, wherein each said lower gate stack of said plurality of lower gate stacks has a substantially rectangular cross-section, the width of the rectangular cross-section of each said lower gate stack of said plurality of lower gate stacks being greater than the width of the rectangular cross-section of the silicon riser projecting therefrom, and wherein each lower gate stack of said plurality of lower gate stacks and each respective silicon riser of said plurality of silicon risers has a thickness that is substantially the same and equal to L, the width of the cross-section of each lower gate stack of said plurality of lower gate stacks is equal to W, the height of the rectangular cross-section of each silicon riser of said plurality of silicon risers is equal to H, and the width of the cross-section of each silicon riser of said plurality of silicon risers is equal to W−(2*U), and wherein the combined end-to-end electrical resistance of the first and second refractory metal silicide layers respectively on each said lower gate stack of said plurality of lower gate stacks and on each said silicon riser of said plurality of silicon risers is equal to L/(2*(W+H−U)).

15. A method of making a gate structure on a substrate assembly as defined in claim 13, further comprising forming an active region within the substrate assembly below the gate oxide layer extending on the substrate assembly between two or more of said lower gate stacks.

16. A method of making a gate structure comprising:

forming a gate oxide layer on a silicon substrate;

forming a first silicon layer on the gate oxide layer;

forming a first refractory metal silicide layer on the first silicon layer;

forming a first electrically insulating layer on the first refractory metal silicide layer;

forming a second silicon layer on the first electrically insulating layer;

selectively removing material from the second silicon layer and removing material from the first electrically insulating layer so as to form a plurality of silicon risers, each of said plurality of silicon risers having a riser silicon layer that is a portion of the second silicon layer and a riser oxide layer that is a portion of the first electrically insulting layer, each said silicon riser having exposed surfaces thereon including a top surface and a width;

selectively removing material from the refractory metal silicide layer and the first silicon layer to form a plurality of lower gate stacks, each said lower gate stack having a lower gate refractory metal silicide layer that is a portion of the first refractory metal silicide layer and a lower gate silicon layer that is a portion of the first silicon layer, each said silicon riser of said plurality of silicon risers projecting from a respective the lower gate stack away from the silicon substrate, each said lower gate stack of said plurality of lower gate stacks having a width greater than the width of the respective silicon riser projecting therefrom; and forming a refractory metal layer upon the exposed surfaces of each of said silicon risers including the top surfaces thereof;

heating the silicon substrate sufficient to substantially react the riser silicon layer of each said silicon riser with the refractory metal layer and thereby form a second refractory metal silicide layer substantially covering exposed surfaces of each said silicon riser including the top surfaces thereof, the second refractory metal silicide making contact with the lower gate refractory metal silicide layer of the respective lower gate stack such that the first refractory metal silicide with the second refractory metal silicide surround each said silicon riser of said plurality of silicon risers.

17. A method of making a gate structure as defined in claim 16, wherein each of said lower gate stack of said plurality of lower gate stacks and the respective silicon riser projecting therefrom has a substantially rectangular cross-section, the width of the rectangular cross-section of each said lower gate stack of said plurality of lower gate stacks being greater than the width of the rectangular cross-section of the respective silicon riser projecting therefrom, and wherein each said lower gate stack and each said respective silicon riser has a thickness that is substantially the same and equal to L, the width of the cross-section of each said lower gate stack is equal to W, the height of the rectangular cross-section of each said silicon riser is equal to H, and the width of the cross-section of each said silicon riser is equal to W−(2*U), and wherein the combined end-to-end electrical resistance of the first and second refractory metal silicide layers respectively on each said lower gate stack and on each said silicon riser is equal to L/(2*(W+H−U)).

18. A method of making a gate structure as defined in claim 17, further comprising forming an active region within the silicon substrate below the gate oxide layer extending on the silicon substrate between two or more of said lower gate stacks.

19. A method of making a gate structure on a silicon substrate comprising:

forming a gate oxide layer on a silicon substrate;

forming a first silicon layer on the gate oxide layer;

forming a first refractory metal silicide layer on the first silicon layer;

forming a first electrically insulating layer on the first refractory metal silicide layer;

forming a second silicon layer on the first electrically insulating layer;

selectively removing material from the second silicon layer and removing material from the first electrically insulating layer so as to form a plurality of silicon risers, each of said plurality of silicon risers having a riser silicon layer that is a portion of the second silicon layer and a riser oxide layer that is a portion of the first electrically insulting layer, each said silicon riser having exposed surfaces including a top surface thereon and a substantially rectangular cross-section;

selectively removing material from the refractory metal silicide layer and the first silicon layer to form a plurality of lower gate stacks, each said lower gate stack having a lower gate refractory metal silicide layer that is a portion of the refractory metal silicide layer and a lower gate silicon layer that is a portion of the first silicon layer, each said silicon riser of said plurality of silicon risers projecting from a respective the lower gate stack away from the silicon substrate, each said lower gate stack of said plurality of lower gate stacks having a substantially rectangular cross-section, the width of the rectangular cross-section of each said lower gate stack of said plurality of lower gate stacks being greater than the width of the rectangular cross-section of the respective silicon riser projecting therefrom; and forming a refractory metal layer upon the exposed surfaces including the top surface of each of said silicon risers;

heating the silicon substrate sufficient to substantially react the riser silicon layer of each said silicon riser with the refractory metal layer and thereby form a second refractory metal silicide layer substantially covering exposed surfaces including the top surface of each said silicon riser, the second refractory metal silicide making contact with the lower gate refractory metal silicide layer of the respective lower gate stack such that the first refractory metal silicide with the second refractory metal silicide surround each said silicon riser of said plurality of silicon risers, wherein each said lower gate stack and each said respective silicon riser has a thickness that is substantially the same and equal to L, the width of the cross-section of each said lower gate stack is equal to W, the height of the rectangular cross-section of each said silicon riser is equal to H, and the width of the cross-section of each said silicon riser is equal to W−(2*U), and wherein the combined end-to-end electrical resistance of the first and second refractory metal silicide layers respectively on each said lower gate stack and on each said silicon riser is equal to L/(2*(W+H−U)); and forming an active region within the silicon substrate below the gate oxide layer on the silicon substrate extending between two or more of said lower gate stacks.

* * * * *

UNITED STATES PATENT AND TRADEMARK OFFICE
CERTIFICATE OF CORRECTION

PATENT NO. : 5,981,367
DATED : Nov. 9, 1999
INVENTOR(S) : Fernando Gonzalez

It is certified that error appears in the above-identified patent and that said Letters Patent is hereby corrected as shown below:

Col. 1, line 34, after "metal" change "suicides" to --silicides--

Col. 3, line 48, after "metal" change "suicides" to --silicides--

Col. 4, line 19, delete "a"

Col. 4, line 20, after "stoichiometric" change "suicides" to --silicides--

Col. 4, line 40, after "phenomena" change "know" to --known--

Col. 4, line 57, delete "10"

Col. 5, line 53, after "riser" change "polysilicon" to --silicide--

Col. 6, line 32, after "of a" delete "is"

Col. 7, line 13, change "50;s" to --50 as--

Col. 7, line 17, after "preferably" change "an" to --a--

Col. 7, line 28, change "forgoing" to --foregoing--

Col. 7, line 51, after "structures" change "63" to --60--

Col. 7, line 54, after "using" change "an" to --a--

Col. 7, line 56, change "preferably" to --preferable--

UNITED STATES PATENT AND TRADEMARK OFFICE
CERTIFICATE OF CORRECTION

PATENT NO. : 5,981,367

DATED : Nov. 9, 1999

INVENTOR(S) : Fernando Gonzalez

It is certified that error appears in the above-identified patent and that said Letters Patent is hereby corrected as shown below:

Col. 7, line 57, after "structures" change "63" to --60--

Col. 8, line 16, after "on top of" change "second oxide layer" to --first silicon layer--

Col. 8, line 67, after "using" change "an" to --a--

Col. 9, line 2, after "50" change "has" to --as--

Col. 9, line 29, after "wordlines" change "see" to --seen--

Signed and Sealed this

Thirtieth Day of January, 2001

Attest:

Q. TODD DICKINSON

*Attesting Officer*  *Director of Patents and Trademarks*